US006785629B2

United States Patent
Rickes et al.

(10) Patent No.: US 6,785,629 B2
(45) Date of Patent: Aug. 31, 2004

(54) ACCURACY DETERMINATION IN BIT LINE VOLTAGE MEASUREMENTS

(75) Inventors: Juergen T. Rickes, Cupertino, CA (US); Hugh P. McAdams, McKinney, TX (US)

(73) Assignees: Agilent Technologies, Inc., Palo Alto, CA (US); Texas Instruments, Inc., Dallas, TX (US)

(*) Notice: Subject to any disclaimer, the term of this patent is extended or adjusted under 35 U.S.C. 154(b) by 104 days.

(21) Appl. No.: 10/190,078

(22) Filed: Jul. 2, 2002

(65) Prior Publication Data

US 2004/0006441 A1 Jan. 8, 2004

(51) Int. Cl.[7] .............................................. G11C 11/22
(52) U.S. Cl. ...................... 702/118; 702/108; 702/110; 702/117; 702/120; 365/145; 714/718
(58) Field of Search ................................. 702/108, 110, 702/117, 118, 120; 365/145, 149, 201, 189.11, 189.09; 714/718

(56) References Cited

U.S. PATENT DOCUMENTS

| 5,677,865 | A | * | 10/1997 | Seyyedy | ...................... 365/145 |
| 6,327,682 | B1 | * | 12/2001 | Chien et al. | ................. 714/718 |
| 6,392,918 | B2 | * | 5/2002 | Braun et al. | ................. 365/145 |
| 6,590,799 | B1 | * | 7/2003 | Rickes et al. | ................ 365/145 |
| 2001/0038557 | A1 | * | 11/2001 | Braun et al. | ........... 365/189.09 |
| 2003/0002368 | A1 | * | 1/2003 | Kang et al. | ................. 365/201 |
| 2003/0185040 | A1 | * | 10/2003 | Rickes et al. | ................ 365/145 |

* cited by examiner

Primary Examiner—Marc S. Hoff
Assistant Examiner—Carol S W. Tsai (57) ABSTRACT

A method and circuit for determining the accuracy of a measurement of a bit line voltage or a charge distribution for readout from FeRAM cells uses sense amplifiers to compare a bit line voltage to a series of reference voltages and then determines upper and lower limits of a range of range of reference voltages for which sensing operation provide inconsistent results. One embodiment uses an output signal of a sense amplifier to control a pull-down transistor of an I/O line and alternative precharging schemes for the I/O line allow determining both limits using the same compression circuitry to process a result value stream on the I/O line.

8 Claims, 3 Drawing Sheets

ACCURACY DETERMINATION IN BIT LINE VOLTAGE MEASUREMENTS

BACKGROUND

A ferroelectric random access memory (FeRAM) generally includes an array of FeRAM cells where each FeRAM cell contains at least one ferroelectric capacitor. Each ferroelectric capacitor contains a ferroelectric material sandwiched between conductive plates. To store a data bit in a FeRAM cell, a write operation applies write voltages to the plates of the ferroelectric capacitor in the FeRAM cell to polarize the ferroelectric material in a direction associated with the data bit being written. A persistent polarization remains in the ferroelectric material after the write voltages are removed and thus provides non-volatile storage of the stored data bit.

A conventional read operation for a FeRAM determines the data bit stored in a FeRAM cell by connecting one plate of a ferroelectric capacitor to a bit line and raising the other plate to a read voltage. If the persistent polarization in the ferroelectric capacitor is in a direction corresponding to the read voltage, the read voltage causes a relatively small current through the ferroelectric capacitor, resulting in a small charge and voltage change on the bit line. If the persistent polarization initially opposes the read voltage, the read voltage flips the direction of the persistent polarization, discharging the plates and resulting in a relatively large charge and voltage increase on the bit line. A sense amplifier can determine the stored value from the resulting bit line current or voltage.

Development, manufacture, and use of an integrated circuit such as FeRAM often require testing that determines the characteristics of the integrated circuit and determines whether the integrated circuit is functioning properly. One important test for a FeRAM is measurement of the charge delivered to bit lines when reading memory cells. Generally, the bit line charge or voltage that results from reading a FeRAM cell varies not only according to the value stored in the FeRAM cell but also according to the performance of the particular FeRAM cell being read. The distribution of delivered charge can be critical to identifying defective FeRAM cells that do not provide the proper charge and to selecting operating parameters that eliminate or minimize errors when reading or writing data.

A charge distribution measurement generally tests each FeRAM cell and must measure the amount of charge read out of the FeRAM cell for each data value. Measuring the readout charge commonly requires using a sense amplifier to compare a bit line signal read from the FeRAM cell to up to 100 or more different reference levels. Each of the comparisons generates a binary signal indicating the results of the comparison. The binary comparison result signals can be output using the same data path used for read operations. Comparing the bit line voltage read from a single FeRAM cell storing a data value "0" or "1" against 100 reference levels generates 100 bits of test data. Accordingly, the amount of test data generate during a distribution measurement for all cells in an FeRAM requires a relatively long time to output using the normal I/O cycle time. Charge distribution measurement for data values "0" and "1" in a 4-Megabit FeRAM, for example, can generate more than $8 \times 10^8$ bits of test data, which may require several minutes to output. Further, the amount of test data and output time increase with memory storage capacity.

The large volume of data output from a FeRAM for a charge distribution measurement may require too much time for an efficient testing during integrated circuit manufacture. Processing the large amount of data to construct bit line voltage distributions can also create a bottleneck in a fabrication process. The amount of data can be reduce by testing only a sampling of the FeRAM cells in a FeRAM but sampling may fail to uncover some defective FeRAM cells.

In view of the current limitation of methods for measuring charge distributions of FeRAMs, structures and methods that reduce the data flow and processing burdens for measurement of charge distributions are sought. The reduced data will ideally indicate the charge distribution information but also indicate the accuracy or the amount of noise in the charge distribution information. Further, the reducing the amount of test data while retaining accuracy information would be best accomplished without requiring large or complex on-chip circuits.

SUMMARY

In accordance with an aspect of the invention, an on-chip circuit measures the distribution of bit line voltages or charge resulting from reading FeRAM cells and compresses distribution data to reduce the amount of output data and the time required for output of the distribution data. The measurement of a bit line voltage typically involves operating a sense amplifier to compare a bit line voltage to a series of reference voltages. Instead of directly outputting result signals from the sense amplifier, a compression circuit processes the result signals to generate values indicating lower and upper limits of a range of reference voltages in which noise can cause sensing operations to provide inconsistent results. A small reference voltage range indicates that bit line voltage was accurately measured.

One embodiment of a compression circuit includes a counter and a set of registers or other storage elements connected to the counter. The counter is synchronized with changes in a reference signal input to a sense amplifier and to the series of comparisons so that the count from the counter indicates a current reference voltage that sense amplifiers are comparing to bit line voltages. Each of the storage elements corresponds to a bit line being tested and operates to store the count from the counter when the binary result values for the comparisons have a particular value. The stored value at the end of the bit line voltage measurement is a count value indicating the reference voltage (or count) that the comparisons first or last indicated as greater than the bit line voltage. To quantify noise in the comparisons, multiple count values for each bit line can be stored using different triggering conditions so that the count values indicate when more than one transition occurs in the results stream.

In one embodiment of the invention, instead of directly connecting the outputs of the sense amplifiers to enable or disable the storage elements, the output signals from the sense amplifiers control the gates of drive devices (e.g., pull-down or pull-up transistors) of a bus connected to provide enable signals to the storage elements. A precharge circuit charges the bus to a state that enables the storage devices to replace a stored value with a fresh value from the counter. Whenever a particular sense amplifier activates its associated drive device, the drive device pulls the enable signal for the corresponding storage element to a state that disables changing the stored value in the storage element. Changing the precharging scheme for the global I/O bus can provide obtain upper and lower limits for the voltage range in which noise can cause inaccurate sensing. One limit is obtained by only precharging the global I/O bus before the series of sensing operations that measure a bit line voltage. With this precharging scheme, the storage element retains the count corresponding to reference voltage just before the first sensing operation that causes the corresponding drive circuit to pull the enable signal to the disabling state. The other limit is obtain by precharging the global I/O line before each sensing operation, which causes the storage element to retain the count corresponding to the last sensing operation that failed to pull the global I/O line to the disabling state.

Another embodiment of the invention is a method for testing an integrated circuit containing FeRAM cells. The test method includes: performing sensing operations that respectively compare a series of reference voltages to a bit line voltage; generating a first data value identifying a first limit for a range of the reference voltages in which the sensing operations provided inconsistent results; and generating a second data value identifying a second limit for the range of the reference voltages in which the sensing operations provided the inconsistent results. A compression circuit in the integrated circuit can generate the first and second data values. The separation between the first and second data values indicates the accuracy of the bit line voltage measurement.

Performing the sensing operations generally generates a result signal representing a series of values with each value distinguishing whether a comparison of a corresponding one of the reference voltages to the bit line voltage indicates the reference voltage or bit line voltage is greater. The first data value can be generated from the result signal for a first series of sensing operations, by applying to a register or other storage element, a data or count signal indicating which of the reference voltages corresponds to a current value of the result signal; precharging a line providing an enable signal to the storage element, and activating a drive circuit (or pull-down transistor) for the line in response to the values of the result signal. In one test mode, precharging, which activates the enable signal to enable the storage element to set a stored value equal to a current value of the data signal, is performed only once before the first series of the sensing operations. The drive circuit when activated pulls the line to a state where the enable signal is deactivated, thereby stopping the storage element from changing the stored value. The stored value in the storage element after the first plurality of sensing operations thus identifies the first reference voltage for which a sensing operation activates the drive circuit to deactivate the enable signal, and that stored value can be the first data value.

The second data value can be generated using a different precharging scheme. In particular, for each sensing operation in a second plurality of the sensing operations, precharging the line reactivates the enable signal. With the values of the result signal corresponding to the second plurality of the sensing operations controlling the drive circuit, the storage element sets the stored value equal to a value of the data signal when the result signal does not activate the driver circuit, and the storage element maintains the stored value when the value of the result signal activates the driver circuit. At the end of the second series of sensing operations, the stored value in the storage element indicates the last reference voltage for which a sensing operation failed to activate the drive circuit, and that stored value can be the second data value.

Another method for generating test results for an integrated circuit containing FeRAM cells includes: charging a line to activate an enable signal of a storage element; performing a first series of sensing operations to generate a result signal having values indicating results of the sensing operations; applying the result signal to control a pull-down device for the line; operating a counter to generate a count value indicating which of the reference voltages corresponds to a current value of the result signal; and for each sensing operation in the first series, setting a stored value in the storage element equal to the count value in response to the enable signal being active at a time corresponding to the sensing operation, and maintaining the stored value in the storage element in response to the enable signal not being active at the time corresponding to the sensing operation. The stored value in the storage element after the first series of sensing operations can be used as a test result. Charging of the line can be limited to before the first series of sensing operations, with no further charging of the line being performed before the end of the first series of sensing operations.

The method can generate further test results using a different precharging scheme. For example, a second series of sensing operations can provide the result signal with values indicating results of the sensing operations in the second series, while charging the line activate the enable signal for each of the sensing operations in the second series. The method can then include for each sensing operation in the second series, setting the stored value in the storage element equal to the count value in response to the enable signal being active at a time corresponding to the sensing operation, and maintaining the stored value in the storage element in response to the enable signal not being active at the time corresponding to the sensing operation. The stored value in the storage element after the second series of sensing operations provides a second test result.

Yet another embodiment of the invention is an integrated circuit including a global bus, an array of FeRAM cells, a reference voltage generator, sense amplifiers, a precharge circuit, and a compression circuit. Driver devices and a precharge circuit are connected to the global bus. The reference voltage generator is operable in a test mode to generate a reference signal that sequentially has a series of reference voltages, and the sense amplifiers compare a bit line voltage to the series of reference voltages. Output signals from the sense amplifiers respectively control the driver circuits. The compression circuit includes storage elements that are respectively coupled to the global bus in the test mode, and the storage elements have an input data signal that indicates which of the reference voltages corresponds to current values of the output signals from the sense amplifiers. Signals on the global bus control whether respective storage elements are enabled to set respective stored values equal to the input data signal. For bit line voltage measurements, the precharge circuit has a first operating mode in which the precharge circuit charges the global I/O bus before each sensing operation by the sense amplifiers and has a second operating mode in which the precharge circuit charges the global I/O bus only once for a series of sensing operations by, the sense amplifiers.

BRIEF DESCRIPTION OF THE DRAWINGS

Use of the same reference symbols in different figures indicates similar or identical items.

DETAILED DESCRIPTION

In accordance with an aspect of the invention, an integrated circuit including a FeRAM array has on-chip circuits capable of measuring a bit line voltage delivered during read operations and a compression circuit that reduces the amount of test data needed to represent the bit line voltage or charge from a single memory cell or a distribution of the bit line voltages that a set of memory cells delivers.

Bit line voltage measurements generally use sense amplifiers that are also used for read operations. For a bit line voltage measurement, each sense amplifier performs a series of sensing operations to compare the voltage on a corresponding bit line to a series of reference voltages. Generally for a series of comparisons, the reference voltages decrease or increase in monotonic steps so that the comparison result from the sense amplifier changes when the bit line voltage is about equal to the reference voltage. (Measuring the bit line voltage also measures the bit line charge, which is about equal to the product of the measured bit line voltage and the capacitance of the bit line.) The compression circuit receives the results from the sense amplifiers during the series of comparisons and extracts the critical information. The test data output from the compression circuit requires less time to output, less time to store, and is more convenient for internal and external use of data representing a bit line voltage or charge distribution.

Figure 1:
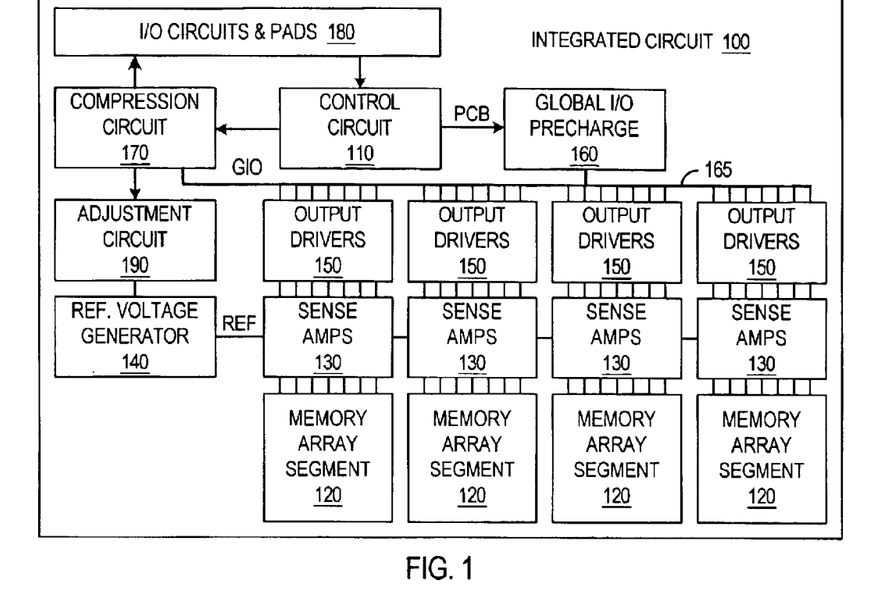
FIG. 1 is a block diagram of a FeRAM in accordance with an embodiment of the invention including a compression circuit for bit line voltage distribution measurements.

FIG. 1 is a block diagram of an integrated circuit 100 in accordance with an embodiment of the invention. Integrated circuit 100 can generally be a memory or any type of integrated circuit using an embedded memory. Integrated circuit 100 includes a control circuit 110, memory array segments 120, sense amplifiers 130, a reference voltage generator 140, output drivers 150, a precharge circuit 160 for global I/O bus 165, a compression circuit 170, I/O circuits and pads 180, and a parameter adjustment circuit 190.

Control circuit 110 is a state machine or other well-known type of control circuit that generates control signals for operation of integrated circuit 100. In a test mode of integrated circuit 100, control circuit 110 controls memory array segments 120, sense amplifiers 130, and reference voltage generator 140 as required to measure the bit line voltages read out of a set of memory cells or measure voltage offsets of sense amplifiers 130. Control circuit 110 also controls compression circuit 170, which compresses the measurement results.

Multiple bit line voltage measurements for the charge distribution measurement are performed in parallel using the same decoding and driver circuits required for a read operation. In an exemplary embodiment of the invention described herein, each memory array segment 120 is an array FeRAM cells, and one row of FeRAM cells in one of FeRAM array segments 120 is selected per memory access (e.g., per read, write, or bit line voltage test). Charge from the selected FeRAM cells are read out to the corresponding bit lines. Alternatively, to measure offsets for a set of sense amplifiers 130 the bit lines corresponding to the sense amplifiers are set to a fixed voltage (e.g., ground voltage Vss).

In either case, control circuit 110 then causes reference voltage generator 140 to step reference voltage REF through a series of reference voltage levels. For each reference voltage level, control circuit 110 controls parallel sensing operations by the selected sense amplifiers 130. The output signals that sense amplifiers 130 generate upon completion of the parallel sensing operations provide a multi-bit result signal GIO. In the exemplary embodiment of the invention, general I/O bus 165 is 64 bits wide, and each array segment 120 has 64 associated sense amplifiers 130 that together generate a 64-bit signal GIO[63:0]. For a bit line voltage measurement or a sense amplifier offset measurement capable of distinguishing between 100 different voltage levels, result signal GIO[63:0] provides 100 different 64-bit values characterizing the results of the sensing operations for the 100 different reference voltages.

In a compression mode, compression circuit 170 receives the series of results (e.g., 100 values of 64-bit signal GIO) and generates one small multi-bit value (e.g., a 7-bit) for each bit line or sense amplifier. In the exemplary embodiment described further below, compression circuit 170 in the compression mode provides more than an order of magnitude decrease in the amount of data and still provides the needed information for a bit line voltage measurement. Compressor circuit 170 also has a pass-through mode that is used during normal read operations and can also be used for direct output comparison results from sense amplifiers 130 when measuring bit line voltages or sense amplifier offsets. In the pass-through mode, data signals from sense amplifiers 130 pass directly through compression circuit 170 to I/O circuits 180.

Figure 2:
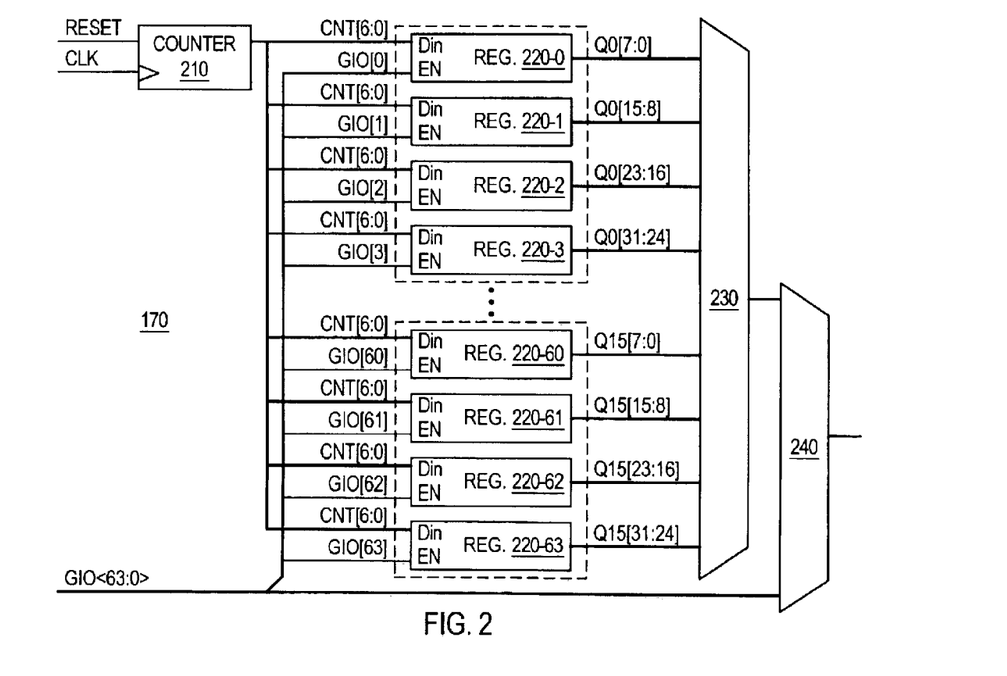
FIG. 2 is a block diagram of an exemplary embodiment of a compression circuit suitable for the FeRAM of FIG. 1.

FIG. 2 is a block diagram of one embodiment of compression circuit 170. The illustrated embodiment of compression circuit 170 includes a counter 210, a set of registers 220, and output multiplexers 230 and 240. Counter 210 is reset when a set of FeRAM cells or sense amplifiers is selected for measurements. At the same time, reference signal REF from reference voltage generator 140 is set to its initial voltage level. Each time counter 210 changes (e.g., increments or decrements) a count signal CNT, reference voltage generator 140 changes the reference voltage level, and sense amplifiers 130 generate result signal GIO to provide 64-bits of new comparison results. The value of count signal CNT is thus synchronized with changes in the reference signal REF and indicates the reference voltage level corresponding to the current comparison results.

During the simultaneous measurements of bit line voltages, each bit of result signal GIO corresponds to a different bit line, and the value of the bit indicates whether the voltage on the corresponding bit line signal BL is currently greater than the voltage of reference signal REF. During a sense amplifier offset measurement, each bit of result signal GIO indicates whether reference signals REF is less than the voltage offset needed to trip the corresponding sense amplifier.

In the exemplary embodiment, registers 220 include a set of 64 registers 220-63 to 220-0 that correspond to respective bits of result signal GIO[63:0]. Each register 220 receives count signal CNT[6:0] as a data input signal. The bits of result signal GIO[63:0] act as the enable signals for respective registers 220-63 to 220-0. For example, a bit of value "1" (indicating the voltage of signal REF is greater than the voltage of signal BL) enables the corresponding register 220 to latch the new count value, and a bit of value "0" (indicating the voltage of signal BL is greater than the voltage of signal REF) disables changing the count value in the corresponding register. Alternatively, each register 220 can be enabled in response to a different condition such as a transition in the values of the corresponding result signal GIO.

In the embodiment of the invention illustrated in FIG. 2, the count value retained in a register 220 after completion of a series of comparisons will be equal to the count corresponding to the last comparison for which the result signal GIO indicated the voltage of reference signal REF was greater than the voltage of bit line signal BL. Accordingly, for a bit line voltage measurement, the stored value indicates the approximate bit line voltage read out of a memory cell, and for a sense amplifier offset measurement, the stored value indicates the offset voltage required to trip the sense amplifier. Compression circuit 170 thus reduces the 100 bits associated with the testing to 7 bits.

Other information can similarly be extracted from the bit streams from sense amplifiers 130. For example, a second set of registers can be connected to latch the count value only the first time that the respective bits of result signal GIO[63:0] are zero. A count in a register in the second set of registers would record another indication of an approximate measured voltage. If a clean transition occurred so that the 100-bit results stream associated with a bit line contains all ones up to a point after which the results stream includes all zeros, the count in the second register set would be one greater than the corresponding count in the first register set. However, if the bit values in the 100-bit data stream alternate indicating variation in the performance of a sense amplifier 130 or other components of the FeRAM, the count in the second register set will be less than the count in the first register set, and the difference between the two counts suggests the magnitude of the variations.

Output multiplexers 230 and 240 in the embodiment of compression circuit 170 shown in FIG. 2 select a data signal for output. In the pass-through mode of compression circuit 170, mulitplexer 240 selects some or all of the bits of signal GIO[63:0] for direct output. For example, if integrated circuit 100 has a 32-bit input/output data path and a 64-bit internal data bus, multiplexer 240 selects 32 bits of signal GIO[63:0]. In compression mode, multiplexer 240 selects and outputs the signal from multiplexer 230.

At the end of a series of comparisons, each register 220 stores a 7-bit value representing a measured voltage. Multiplexer 230 selects output signals from a subset of registers 220. For example, four 7-bit measurement values from a group of four registers 220 can be output via a 32-bit data path. Accordingly, the bit line measurements for 64 FeRAM cells in the exemplary embodiment of compression circuit 170 require 16 output cycles through multiplexers 230 and 240, instead of 200 output cycles, which would be required to output the values of result signal GIO.

Integrated circuit 100 of FIG. 1 can output or use internally the bit line measurements and offset data from compression circuit 170. For example, adjustment circuit 190 can receive and use the compressed bit line voltage measurement for defect detection or for setting operating parameters.

In one embodiment, adjustment circuit 190 includes first and second registers that store compressed bit line measurements that compression circuit 170 generates. The first register records the highest measured bit line voltage read out of a FeRAM cell storing the data value (e.g., "0") corresponding to the polarization of a ferroelectric capacitor that is not flipped during reading. The second register records the lowest bit line charge or voltage read out of a FeRAM cell storing the data value (e.g., "1") corresponding to the polarization of a ferroelectric capacitor that is flipped during reading. Parameter adjustment circuit 190 can detect a defect if the highest bit line voltage associated with reading an unflipped ferroelectric capacitor is greater than or too close to the lowest bit line voltage associated with a ferroelectric capacitor flipped during reading. If the separation between the recorded values is acceptable, adjustment circuit 190 can select a reference voltage for read operations to be between the values in the two registers.

The preceding paragraph merely gives example functions of adjustment circuit 190. Adjustment circuit 190 could perform more complicated analysis of the charge distribution or the bit line voltage measurements. For example, error detection and the reference voltage setting can be performed separately for each FeRAM array segment 120 and the characterization of the charge distribution used in error detection and parameter setting can use more than just the maximum and minimum bit line voltages for the different data values.

Figure 3:
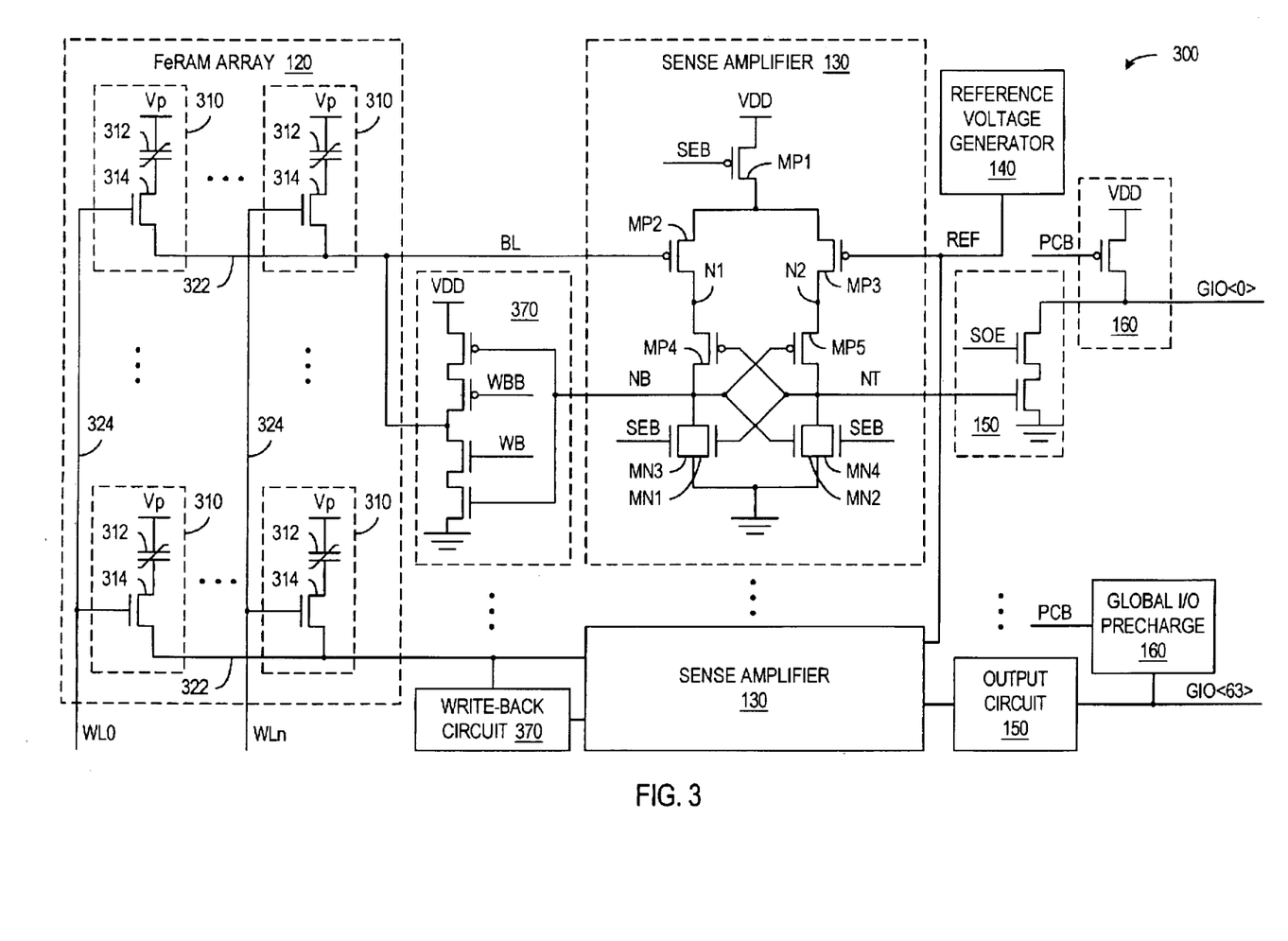
FIG. 3 is a circuit diagram of a portion of a FeRAM associated with reading and measuring bit line charge of FeRAM cells connected to a bit line.

The compression of bit line charge distribution data described above can be used with a variety of different sensing techniques, sense amplifier types, and FeRAM architectures. FIG. 3 shows a portion of a FeRAM 300 capable of implementing charge distribution measurements suitable for compression. FeRAM 300 contains one FeRAM array segment 120, sense amplifiers 130, reference voltage generator 140, global output drivers 150, precharge circuits 160, and write-back circuits 170.

FeRAM array segment 120 is a conventional array of FeRAM cells 310 that are organized into rows and columns. Each FeRAM cell 310 includes a ferroelectric capacitor 312 and a select transistor 314, which can be fabricated using known techniques. Bit lines 322 connect to drains of select transistors 314 of FeRAM cells 310 in respective columns of FeRAM array section 120. Word lines 324 connect to the gates of select transistors 314 in respective rows of FeRAM array section 120, and a row decoder and driver circuits (not shown) control voltages WL0 to WLn on word lines 324 during write, read, and measurement operations. FeRAM array section 120 can be one of several local array segments in a memory architecture having local and global decoding circuits (not shown) and having data paths including global input/output lines that connect the local arrays for data input and output.

In the embodiment of FIG. 3, each sense amplifier 130 is a comparator-type sense amplifier that connects to the corresponding bit line 322. Alternatively, sense amplifier 130 can be of a type that changes the bit line voltage during a sense operation, in which case the bit line voltage must be reset (e.g., re-read from an FeRAM cell) each time the reference voltage signal changes. Each sense amplifier 130 could also connect to local column decoding circuitry that selectively connects one of multiple bit lines 322 to sense amplifier 130 for read operations or for measuring the bit line charge read from a FeRAM cell to the bit line 322.

FIG. 3 further illustrates an implementation of a comparator-type sense amplifier 130 that includes p-channel transistors MP1, MP2, MP3, MP4, and MP5 and n-channel transistors MN1, MN2, MN3, and MN4. Transistor MP1 serves to activate and deactivate sense amplifier 130 in response to a sense enable signal SEB and is between a supply voltage VDD and transistors MP2 and MP3. Transistors MP2, MP4, and MN1 are connected in series between transistor MP1 and ground, and transistors MP3, MP5, and MN2 are similarly connected in series between transistor MP1 and ground. Transistors MN3 and MN4 are connected in parallel with transistors MN1 and MN2, respectively, and respond to sense enable signal SEB by grounding respective nodes N1 and N2 in preparation for comparison operations.

The gates of transistors MP2 and MP3 respectively receive input signals BL and REF from the corresponding bit line 322 and reference voltage generator 140 respectively. Signal BL is the bit line voltage and for a bit line voltage measurement, depends on the charge read from a FeRAM cell 310 onto the bit line 322 connected to sense amplifier 130. Signal REF is a reference signal having a voltage that reference voltage generator 140 sets and changes. Reference voltage generator 140 can be any circuit capable of generating a series of different voltage levels for signal REF. Alternatively, signal REF can be input from an external circuit to avoid the need for an on-chip reference voltage generator capable of generating a large number (e.g., 100) of different reference voltage levels.

A voltage difference between bit line signal BL and reference signal REF determines whether transistor MP2 or MP3 is more conductive, which in turn influences whether the voltage on node N1 between transistors MP2 and MP4 or the voltage on node N2 between transistors MP3 and MP5 rises more quickly when sense amplifier 130 is activated. Both transistors MP4 and MP5 are initially on during a sensing operation, so that an output signal NB from a node between transistors MP4 and MN3 and an output signal NT from a node between transistors MP5 and MN4 initially rise at rates depending on the rise in the voltages on nodes N1 and N2, respectively. The gates of transistors MP4, MP5, MN1, and MN2 are cross-coupled, so that transistors MP4, MP5, MN1, and MN2 amplify a voltage difference that develops between output signals NB and NT. As a result, output signal NT is complementary to output signal NB when the sensing operation is complete.

Output circuit 150 receives output signal NT from sense amplifier 130 and controls output of the result signal to a line of global I/O bus 165. As described further below, precharge circuits 160 charge the lines of global I/O bus 165 high (e.g., to supply voltage VDD) either before each sensing operation or just before a series of sensing operations that measures a bit line voltage. If signal NT indicates the bit line signal BL has a voltage greater than the voltage of reference signal REF, output driver 150 pulls down a precharged signal GIO in response to an output enable signal SOE. If global I/O bus 165 is precharged immediately before each sensing operation, signal GIO sequentially indicates a series of binary values representing the results from comparing bit line signal BL to the series of voltage levels of reference signal REF. If global I/O bus is only precharged before the series of sensing operations that measure a bit line voltage, each bit of result signal GIO will remain high until a sensing operation indicates the corresponding bit line voltage is greater than voltage REF at which point signal NT goes high and output circuit 150 pulls down that bit of result signal GIO.

Write-back circuit 370 is not required for bit line voltage measurements unless the data in a FeRAM cell needs to be restored after a bit line voltage measurement. After a sensing operation, write-back circuit 370 receives complementary sense amplifier output signal NB and when enabled drives bit line 322 to the appropriate level for writing the data value read from a FeRAM cell back into the FeRAM cell. In FIG. 3, write-back circuit 370 is a tri-state inverter that drives bit line 322 in response to complementary write-back signals WB and WBB. For the distribution measurement, the write-back can be skipped if data is stored in FeRAM cells solely for the distribution measurement. Alternatively, the write-back can be performed after the bit line voltage has been compared to each of the voltage levels of reference signal REF.

Figure 4A:
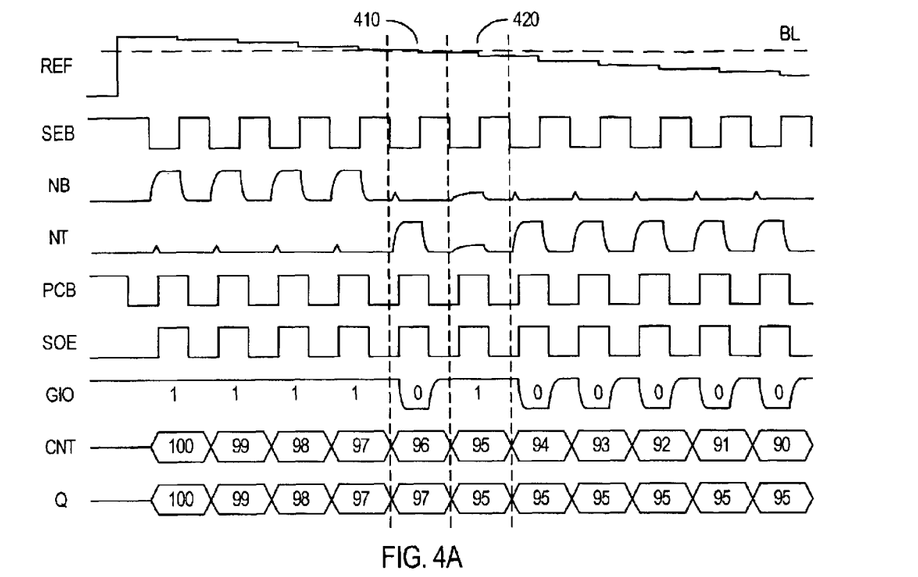
FIGS. 4A and 4B show timing diagrams for selected signals in the FeRAM of FIG. 3 during a bit line voltage measurement.

FIG. 4A shows timing diagrams for selected signals during a measurement that determines a bit line voltage resulting from reading a particular FeRAM cell using the circuitry of FIGS. 2 and 3. For the measurement, reference signal REF steps through a series of voltage levels corresponding to different charges on a bit line. Generally, the range of the reference voltages depends on the properties of the FeRAM cells and particularly the expected range of bit line voltages that may be read out of the FeRAM cells. In an exemplary embodiment, reference signal REF ranges from 0.5 V to 0 V in 100 steps of about 5 mV. FIG. 4A shows an example where reference signal REF starts at the upper limit of the voltage range and steps down, but reference signal REF could increase in steps from the lower voltage limit or change in any desired pattern.

Bit line voltage BL is read out from a FeRAM cell 310 to a bit line 322 and remains constant while being measured if a comparator-type sense amplifier performs the sensing.

Sense enable signal SEB is activated (low) in a series of intervals corresponding to different voltage levels of reference signal REF. When signal SEB is active, the sense amplifier 130 connected to the bit line 322 being measured compares signals BL and REF. Depending on whether signal BL or REF is at a higher voltage, node voltage NB or NT rises to supply voltage VDD, and the other node voltage NT or NB settles back to 0 volts after the sensing period. Since a comparator-type sense amplifier does not need to wait for readout from a FeRAM cell before starting another sensing operation, the period of signal SEB can be approximately equal to the sensing time or about 5 ns for a typical implementation of sense amplifier 130.

Generating the result signal GIO of the sensing operations includes precharging the global output lines to supply voltage VDD and then enabling use of signal NT to control a pull-down device in output driver 150. For the timing diagram of FIG. 4A, a precharge signal PCB is activated (low) for each sensing operation and causes pull-up device 160 to pull the global I/O line to supply voltage VDD. Sense output enable signal SOE is activated (high) when precharge signal PCB is deactivated and after a short delay, typically about 1 to 2 ns, following activation of sense enable signal SEB. The delay is sufficient for node voltages NT and NB to settle to the levels indicating the results of the comparison of signals BL and REF. As a result, output circuit 150 either leaves result signal GIO at the precharged level (VDD) indicating the bit line voltage BL is greater than reference voltage REF or pulls result signal GIO down indicating bit line voltage BL is less than reference voltage REF.

During the series of intervals when sense output signal SOE is activated, result signal GIO indicates a series of binary values indicating the results of the voltage comparisons. As a result for 100 different voltage levels of reference signal REF, result signal GIO serially provides 100 bits of data representing different comparison results. For the case where reference signal REF consistently steps down (or up), ideal operation of the FeRAM will provide a stream of result values associated with bit line signal BL has one binary value (e.g., "1") until reference signal REF fall below the voltage of bit line signal BL. Thereafter, the bit stream is expected to have the other binary value (e.g., "0"). This ideal stream of results can be represented, without loss of information, by a compressed value indicating when result signal GIO transitions from "1" to "0".

Compression circuit 170 in the embodiment of FIG. 2 has result signal GIO connected to enable latching of the count value CNT into a register 220 corresponding to result signal GIO. In the timing diagram of FIG. 4A, count value CNT decreases to match the decline in reference signal REF, and when result signal GIO has the value "1", a data signal Q from register 220 changes each time count value CNT changes. If result signal GIO has the value "0", measurement value Q from register 220 remains unchanged. Measurement value Q for an ideal bit stream with a single transition in bit stream represented by result signal GIO indicates the reference voltage at the transition in the bit stream.

Noise or other variations in the FeRAM may cause the binary values of result signal GIO to alternate when signals REF and BL have approximately the same voltage. The timing diagram of FIG. 4A illustrates a case where sensing operations 410 and 420 provide inconsistent results. When the bit line voltage BL and reference voltage REF are approximately equal, sensing operation 410 provides a result value "1" indicating bit line voltage BL is greater than reference voltage REF, but after reference voltage REF is decreased one step, sensing operation 420 provides a result value "0" indicating bit line voltage BL is less than reference voltage REF. For small voltage differences, such inconsistencies may arise from variation in the performance of the sense amplifier 130 or other circuitry in the FeRAM.

At the end of the bit stream representing comparisons results, measurement value Q in the register corresponding to a bit line being sensed has a value indicating the last time result signal GIO enabled register 220. In FIG. 4A, sensing operation 420 is the last that provides result signal GIO with value "1", and measurement value Q has value 95 at the end of the bit line measurement. The single value Q does not indicate that there was a variation in performance or a sensing inconsistency between sensing operations 410 and 420.

Figure 4B:
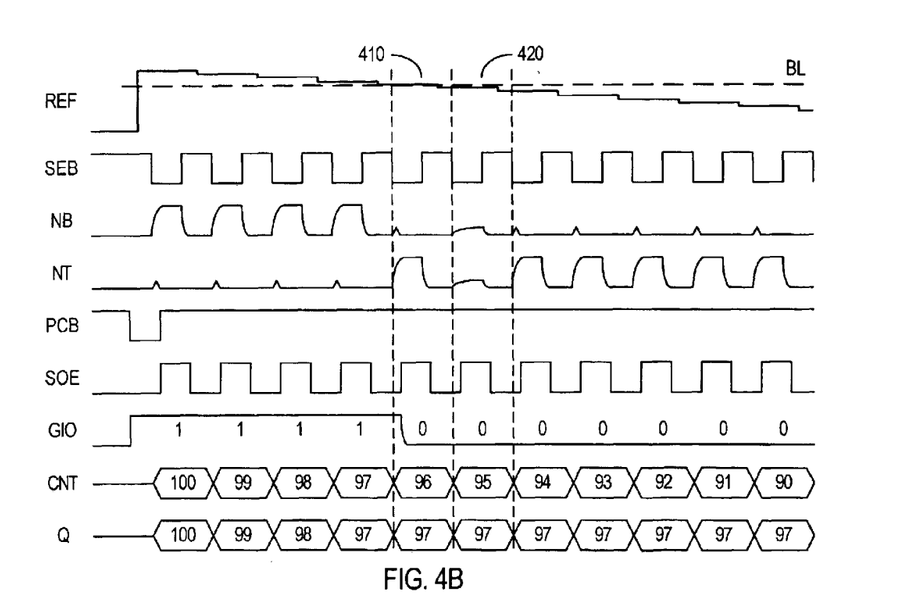

In accordance with an aspect of the invention, a FeRAM with a compression circuit can observe variations in sensing performance merely by using an alternative precharge scheme for the global I/O bus. Timing diagram 4B illustrates an alternative timing of selected signals in the FeRAM circuitry of FIGS. 2 and 3 during a measurement of a bit line voltage. In FIG. 4B, reference signal REF, bit line signal BL, sense enable signal SEB, sense amplifier output node signals NB and NT, and sense amplifier output enable signal SOE are generated in the same manner and have the same timing as described with reference to FIG. 4A. FIG. 4B, however, illustrates an alternative precharge timing.

In FIG. 4B, precharge enable signal PCB is activated low only once for the entire series of comparisons that measure the bit line voltage. Result signal GIO is thus precharged to supply voltage VDD and represents value "1" until a sensing operation first generates a result indicating reference voltage REF is greater than bit line voltage BL. When a sensing operation activates output signal NT (high), output driver 150 (FIG. 3) pulls down the precharged result signal GIO, and result signal represents value "0". Result signal GIO continues to represent value "0" regardless of the results of subsequent sensing operations because in FIG. 4B, no precharge operation restores signal GIO to the precharged value.

The register 220 corresponding to result signal GIO changes measurement value Q each time count CNT changes until result signal GIO represents value "0". Since result signal GIO remains a value "0" after being pulled down, measurement value Q at the end of the bit line voltage measurement is equal to the count CNT corresponding first sensing operation indicating that reference voltage REF is greater than bit line voltage BL. In the illustrated example, where sensing operations 410 and 420 are inconsistent, measurement value Q ends up as 97 with the bit line precharge scheme of FIG. 4B instead of 95, which measurement value Q has for the bit charge scheme of FIG. 4A. More generally, the measurement value Q found using the precharge scheme of FIG. 4B provides one boundary of a reference voltage range for which sensing results oscillate and are inconsistent, and the measurement value Q found using the precharge scheme of FIG. 4A provides the other boundary of that reference voltage range.

In accordance with an aspect of the invention, a bit line voltage can be measured once with the precharge scheme of FIG. 4A and a second time with the precharge scheme of FIG. 4B. A difference in the two measurement values indicates the amount of variation in the performance of sensing operations.

Although the invention has been described with reference to particular embodiments, the description is only an example of the invention's application and should not be taken as a limitation. In particular, although the above description concentrated on exemplary embodiments employing comparator-type sense amplifiers that can compare a bit line voltage to a reference voltage without changing the bit line voltage, other types of sense amplifiers, which may change the bit line voltage, can be used to generate a binary results stream for compression. Various other adaptations and combinations of features of the embodiments disclosed are within the scope of the invention as defined by the following claims.

What is claimed is:

1. A method for testing an integrated circuit containing FeRAM cells, comprising:

performing sensing operations that respectively compare reference voltages to a bit line voltage, wherein performing the sensing operations generates a result signal representing a series of values with each value distinguishing whether a comparison of a corresponding one of the reference voltages to the bit line voltage had a first result or a second result;

generating a first data value identifying a first limit for a range of the reference voltages in which the sensing operations provided inconsistent results; and generating a second data value identifying a second limit for the range of the reference voltages in which the sensing operations provided the inconsistent results, wherein generating the first data value comprises:

applying a data signal to a storage element, the data signal indicating which of the reference voltages corresponds to a current value of the result signal;

precharging a line connected to the storage element, wherein precharging is performed only once before a first plurality of the sensing operations, and wherein precharging the line activates an enable signal that enables the storage element to set a stored value equal to a current value of the data signal;

activating a drive circuit in response to the values of the result signal corresponding to the first plurality of the sensing operations, wherein the drive circuit when activated pulls the line to a state where the enable signal is deactivated, the storage element being disabled from changing the stored value while the enable signal is deactivated; and providing as the first data value, the stored value in the storage element after the first plurality of sensing operations.

2. The method of claim 1, wherein a compression circuit in the integrated circuit generates the first and second data values.

3. The method of claim 1, wherein generating the second data value comprises:

for each sensing operation in a second plurality of the sensing operations, precharging the line to activate the enable signal;

activating the drive circuit in response to the values of the result signal corresponding to the second plurality of the sensing operations, wherein the storage element sets the stored value equal to a value of the data signal when the result signal does not activate the driver circuit, and wherein the storage element maintains the stored value when the value of the result signal activates the driver circuit; and providing as the second data value, the stored value in the storage element after the second plurality of sensing operations.

4. A method for generating test results for an integrated circuit containing FeRAM cells, the method comprising:

charging a line to activate an enable signal that enables operation of a storage element;

performing a first series of sensing operations to generate a result signal having values indicating results of the sensing operations;

applying the result signal to control a pull-down device for the line, wherein when the result signal activates the pull-down device, the pull-down device deactivates the enable signal;

operating a counter to generate a count value indicating which of reference voltages corresponds to a current value of the result signal;

for each sensing operation in the first series, setting a stored value in the storage element equal to the count value in response to the enable signal being active at a time corresponding to the sensing operation, and maintaining the stored value in the storage element in response to the enable signal not being active at the time corresponding to the sensing operation; and using as a test result, the stored value in the storage element after the first series of sensing operations.

5. The method of claim 4, wherein charging the line is performed before the first series of sensing operations, and no further charging is performed before the end of the first series of sensing operations.

6. The method of claim 5, further comprising:

performing a second series of sensing operations to provide the result signal with values indicating results of the sensing operations in the second series;

charging the line to activate the enable signal for each of the sensing operations in the second series;

for each sensing operation in the second series, setting the stored value in the storage element equal to the count value in response to the enable signal being active at a time corresponding to the sensing operation, and maintaining the stored value in the storage element in response to the enable signal not being active at the time corresponding to the sensing operation; and using as another test result, the stored value in the storage element after the second series of sensing operations.

7. The method of claim 4, charging the line is performed for each of the sensing operations in the first series of sensing operations.

8. An integrated circuit comprising:

a global bus;

an array of FeRAM cells including bit lines coupled to respective columns of the FeRAM cells;

a reference voltage generator operable in a test mode to generate a reference signal that sequentially has a series of reference voltages;

sense amplifiers connected to the bit lines and the reference voltage generator;

driver devices respectively controlled by output signals from the sense amplifiers, the output drivers being connected to the global bus during an access to FeRAM cells on the bit lines coupled to the sense amplifiers;

a precharge circuit coupled to the global I/O bus, wherein the precharge circuit has a first operating mode in which the precharge circuit charges the global I/O bus before each sensing operation by the sense amplifiers and has a second operating mode in which the precharge circuit charges the global I/O bus only once for a series of sensing operations by the sense amplifiers; and an on-chip compression circuit comprising storage elements respectively coupled to the global bus in the test mode, wherein the storage elements have an input data signal that indicates which of the reference voltages corresponds to current values of the output signals from the sense amplifiers, and wherein signals on the global bus control whether respective storage elements are enabled to set respective stored values equal to the input data signal.

* * * * *